(12) United States Patent
Ritter

(10) Patent No.: US 8,199,992 B2
(45) Date of Patent: Jun. 12, 2012

(54) METHOD FOR CORRECTION OF DISTORTION IN IMAGE DATA RECORDS RECORDED BY MEANS OF A MAGNETIC RESONANCE SCANNER, AS WELL AS A COMPUTER PROGRAM, IMAGE PROCESSING UNIT AND MAGNETIC RESONANCE SCANNER FOR CARRYING OUT THE METHOD

(75) Inventor: Dieter Ritter, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 998 days.

(21) Appl. No.: 12/219,275

(22) Filed: Jul. 18, 2008

(65) Prior Publication Data

US 2009/0022385 A1 Jan. 22, 2009

(30) Foreign Application Priority Data

Jul. 20, 2007 (DE) .......................... 10 2007 033 897

(51) Int. Cl.
*G06K 9/00* (2006.01)
(52) U.S. Cl. ...................................... 382/131
(58) Field of Classification Search .......... 382/128–132, 382/294–298; 600/407, 410, 411
See application file for complete search history.

(56) References Cited

U.S. PATENT DOCUMENTS

| 4,585,992 A | 4/1986 | Maudsley et al. | 324/309 |
| 4,661,775 A | 4/1987 | Kormos et al. | 324/307 |
| 4,720,679 A | 1/1988 | Patrick et al. | 324/309 |
| 4,970,457 A | 11/1990 | Kaufman et al. | |
| 5,581,184 A | 12/1996 | Heid | |
| 5,823,959 A | 10/1998 | Rasche | 600/410 |

(Continued)

FOREIGN PATENT DOCUMENTS

DE 4445782 C1 7/1996

(Continued)

OTHER PUBLICATIONS

Office Action for co-pending U.S. Appl. No. 12/218,708.

(Continued)

*Primary Examiner* — Courtney Thomas
(74) *Attorney, Agent, or Firm* — Harness, Dickey & Pierce, P.L.C.

(57) ABSTRACT

A method is disclosed for correction of distortion, which is created by way of discrepancies in a basic magnetic field of a magnetic resonance scanner, in image data records which are recorded via the magnetic resonance scanner. In at least one embodiment, the method includes loading a first image data record, recorded via the magnetic resonance scanner with a first frequency coding gradient, of an examination region; loading a second image data record, recorded via the magnetic resonance scanner but using a second frequency coding gradient, of the same examination region, with the first and the second frequency coding gradient being different; receiving a transformation shift field as final result of a registration process of the first and the second image data record; calculating a correction shift field for the first and/or the second image data record on the basis of the calculated transformation shift field; correcting the distortion of the first and/or second image data record on the basis of the calculated correction shift field; and displaying and/or storing the corrected image data record or the corrected image data records. A computer program, an image processing unit and a magnetic resonance scanner for carrying out the method are also disclosed.

13 Claims, 2 Drawing Sheets

U.S. PATENT DOCUMENTS

| | | | | |
|---|---|---|---|---|
| 5,886,524 | A | 3/1999 | Krieg | 324/312 |
| 6,150,815 | A | 11/2000 | Connell | |
| 6,252,401 | B1 | 6/2001 | Werthner et al. | 324/401 |
| 2002/0048340 | A1 | 4/2002 | Schaeffter et al. | |
| 2004/0032261 | A1 | 2/2004 | Schweikard et al. | 324/309 |
| 2005/0035763 | A1 | 2/2005 | Canda et al. | 324/309 |
| 2005/0099504 | A1 | 5/2005 | Nayar et al. | 348/222.1 |
| 2007/0018645 | A1 | 1/2007 | Wang et al. | 324/307 |
| 2007/0142723 | A1 | 6/2007 | Leach et al. | 600/410 |
| 2008/0068012 | A1 | 3/2008 | Werthner | 324/309 |
| 2008/0285835 | A1* | 11/2008 | Holland et al. | 382/131 |
| 2009/0021258 | A1 | 1/2009 | Ritter | |
| 2009/0022384 | A1 | 1/2009 | Ritter | |

FOREIGN PATENT DOCUMENTS

| | | |
|---|---|---|
| DE | 198 29 850 | 6/2000 |
| DE | 195 40 837 | 9/2004 |
| DE | 10337241 | 3/2005 |
| DE | 102006033248 | 1/2008 |
| EP | 0391515 A2 | 10/1990 |
| EP | 1209481 A1 | 5/2002 |
| WO | WO 95/30908 | 11/1995 |

OTHER PUBLICATIONS

Skare, Andersson: "Correction of MR Image Distortions Induced by Metallic Objects Using a 3D Cubic B-Spline Basis Set: Application to Stereotactic Surgical Planning" in: Magnetic Resonance in Medicine 54:169-181 (2005); Magazine.

German Office Action dated Jan. 22, 2009.

Rueckert, D. et al.; Nonrigid Registration Using Free-Form Deformations: Application to Breast MR Images; IEEE Transactions on Medical Imaging, vol. 18, No. 8, Aug. 1999; 8; Others;1999.

Rohlfing, Torsten; Multimodale Datenfusion für die bildgesteuerte Neurochiurgie und Strahlentherapie; Dissertation; Berlin; Others; 2000.

Lee, S. et al.; Scattered Data Interpolation with Multilevel B-Splines; IEEE Transactions on Visualization and Computer Graphics, vol. 3, No. 3, Jul.-Sep. 1997; 3; Magazine; 1997.

Seim, Heiko; Automatische Registrierung mittels Mutual-Information am Beispiel von Schädel-CT-und MR-Datensätzen; Otto-von-Guericke-Universität Magdeburg; Praktikumsbericht Apr. 13, 2004-Sep. 10, 2004; Magdeburg; Others; 2004.

U.S. Office Action for corresponding U.S. Appl. No. 12/219,270 dated Oct. 27, 2011.

Jezzard, et al., "Correction for Geometric Distortion in Echo Planar Images from B0 Field Variations," Magnetic Resonance in Medicine 34, 1995, pp. 65-73.

* cited by examiner

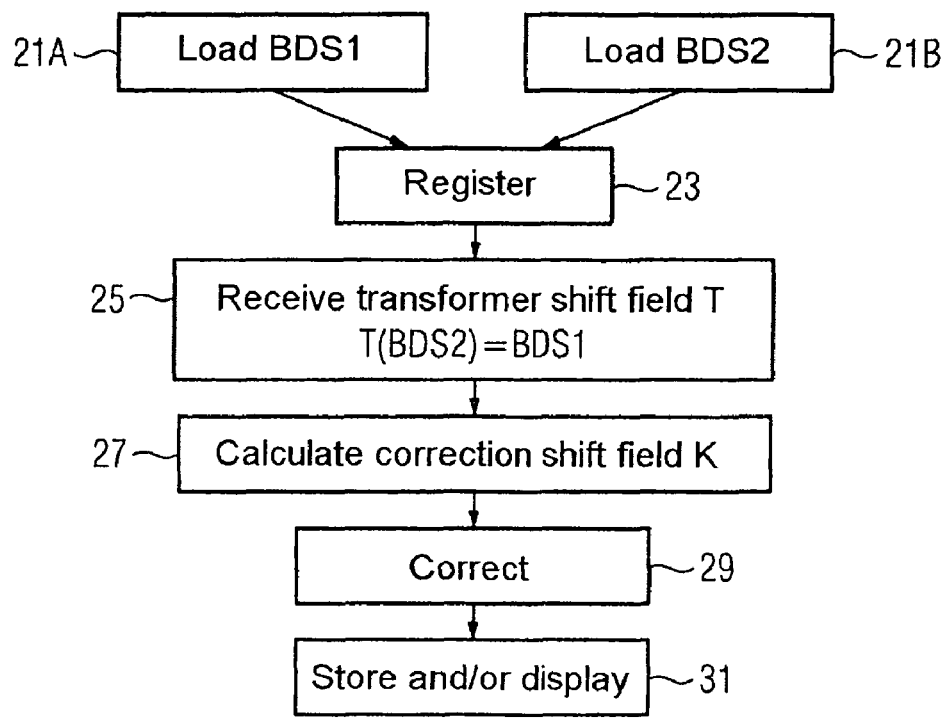
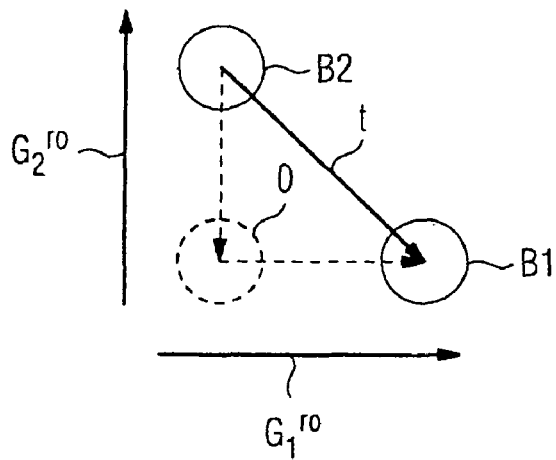
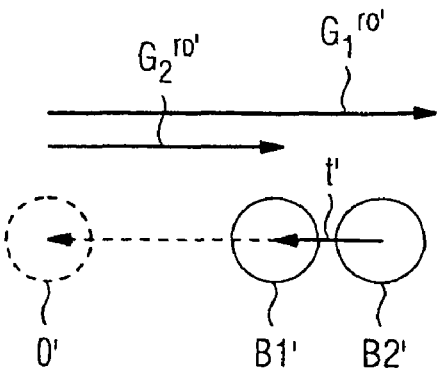

METHOD FOR CORRECTION OF DISTORTION IN IMAGE DATA RECORDS RECORDED BY MEANS OF A MAGNETIC RESONANCE SCANNER, AS WELL AS A COMPUTER PROGRAM, IMAGE PROCESSING UNIT AND MAGNETIC RESONANCE SCANNER FOR CARRYING OUT THE METHOD

PRIORITY STATEMENT

The present application hereby claims priority under 35 U.S.C. §119 on German patent application number DE 10 2007 033 897.1 filed Jul. 20, 2007, the entire contents of which is hereby incorporated herein by reference.

FIELD

Embodiments of the invention generally relate to a method for correction of distortion in image data records recorded by way of a magnetic resonance scanner.

Embodiments of the invention likewise generally relate to a computer program, to an image processing unit and/or to a magnetic resonance scanner for carrying out the method.

BACKGROUND

Magnetic resonance is a known technique by which images of the interior of an examination object can be produced. In this case, the relationship between the precession frequencies (Larmor frequencies) of excited spins and the magnetic field strength of the magnetic field in the magnetic resonance scanner is used for position resolution. The magnetic field that is used is in this case composed of the basic magnetic field of the magnetic resonance scanner and applied gradient magnetic fields. Normal methods for reconstruction of image data records from magnetic resonance signals are predicated on a homogeneous basic magnetic field and strictly linear gradient magnetic fields.

The relationship between the Larmor frequencies and the magnetic field that is used results in geometric distortion along the frequency coding direction (read direction) in the image data records obtained from the magnetic resonance signals, if there are any inhomogeneities in the basic magnetic field. In this case, the distortion is proportional to local discrepancies in the basic magnetic field, and is inversely proportional to the strength of the frequency coding gradient.

If there are non-linearities in the gradient fields, the distortion occurs not only on the tomographic image plane, but also at right angles to this in the case of slice stimuli with a selection gradient. In practice, such inhomogeneities in the basic magnetic field and non-linearities in the gradient fields cannot be avoided completely. Nevertheless, the discrepancies in the basic magnetic field, that is to say the inhomogeneity, within a measurement volume of a magnetic resonance scanner should be less than 3 parts per million (ppm).

The resultant distortion in this case relates not only to the geometric position of the image data reconstructed from the magnetic resonance signals, but also to the reconstructed image signal strength. Attenuation of the image signal strength can occur in this case, for example, by dephasing of the spins in the presence of strong local basic field inhomogeneities. Further corrupting changes in the image signal strength are possible as a result of the spatial distribution of the intensity values, determined from the magnetic resonance signals, on an area whose size differs from the actual area.

The reasons why inhomogeneities occur in basic magnetic fields in magnetic resonance scanners are, for example, linked to the design, that is to say they are dependent, for example, on the design and winding geometry of the basic field magnet, the shielding and any shim apparatuses that are present. Inhomogeneities in the basic magnetic field caused in this way are static, that is to say they remain essentially constant over time.

Static inhomogeneities in the basic magnetic field may be measured, for example, with the aid of a measurement phantom at a number of measurement points on a surface of a conductor-free volume. The basic magnetic field can be determined at any point within the volume in a known manner from the values measured at the measurement points. In this case, the accuracy of the determination of the basic magnetic field depends on the one hand on the measurement accuracy of the measurement phantom, and on the other hand on the accuracy of the algorithm for determination of the basic magnetic field from the measurement points.

Further reasons for inhomogeneities in a magnetic field in a magnetic resonance scanner are, for example, susceptibility changes caused by an examination object being introduced into the magnetic resonance scanner, dynamic disturbances caused by eddy currents or artifacts such as "chemical shift", flux artifacts or movements of the examination object. Inhomogeneities caused in this way depend on the respective situation, for example the nature of the examination and the examination object.

Any type of distortion in image data records is undesirable, in particular in medical image data records, since this corrupts a diagnosis, or at least makes it more difficult. Because of the various possible reasons for and types of distortion, various methods are already known in order to correct for the various types of distortion in image data records.

One method for distortion correction for gradient non-linearities in magnetic resonance scanners is known from DE 195 40 837 B4. In this case, two auxiliary data records which describe a shift of a measured point with respect to an actual point of a signal origin are used to carry out position corrections in the x and y directions. Intensity corrections are also used, in addition to the position corrections.

DE 198 29 850 C2 describes a method for reconstruction of a planar slice image from magnetic resonance signals in inhomogeneous magnetic fields. In this case, image elements of a planar slice image are produced from a plurality of original image elements on curved slices in the examination object.

WO 95/30908 A1 describes a method in which a generalized Fresnel transformation (GFT reconstruction) is carried out in the read direction. The GFT reconstruction takes account of any known position dependency of the main magnetic field in the read direction in order to allow distortion and intensity errors to be corrected for during the transformation from the measurement data space (k space) to the position space.

There is also a requirement for powerful methods for correction for distortion in image data records recorded by means of magnetic resonancing.

SUMMARY

At least one embodiment of the invention involves making it possible, in a simple and at the same time effective manner, to correct for distortion in image data records recorded by way of a magnetic resonance scanner.

In this case, the method according to at least one embodiment of the invention for correction of distortion, which is created by way of discrepancies in a basic magnetic field of a magnetic resonance scanner, in image data records which are recorded by way of the magnetic resonance scanner, comprises:

load a first image data record, recorded by way of the magnetic resonance scanner with a first frequency coding gradient, of an examination region, load a second image data record, recorded by way of the magnetic resonance scanner but using a second frequency coding gradient, of the same examination region, with the first and the second frequency coding gradient being different, receive a transformation shift field as the final result of a registration process of the first and the second image data record, calculate a correction shift field for the first and/or the second image data record on the basis of the calculated transformation shift field, correct the distortion of the first and/or second image data record on the basis of the calculated correction shift field, and display and/or store the corrected image data record or the corrected image data records.

An elastic registration process is advantageously used for registration. Elastic registration processes, for example those described further below, produce high-quality registration results quickly and reliably.

One major advantage of the method according to at least one embodiment of the invention is that the basic magnetic field and in particular its inhomogeneity need not be explicitly known, since this is purely an image-based method. This therefore avoids physical basic magnetic field measurements, which are often inaccurate, for example by way of a measurement phantom, which represent the basis of previous correction methods.

Furthermore the correction in the method according to at least one embodiment of the invention is always based on the situation at that time in the magnetic resonance scanner. This represents a further advantage over the previous methods, which were based on basic magnetic field measurements, since instabilities in the basic magnetic field over long time periods have no influence whatsoever on the method according to at least one embodiment of the invention.

Furthermore, the method according to at least one embodiment of the invention also takes account of local basic magnetic field changes introduced by patients or examination objects, because the instantaneous actual state of the basic magnetic field is always recorded.

Furthermore, at least one embodiment is directed to a computer program, at least one embodiment is directed to an image processing unit, and at least one embodiment is directed to a magnetic resonance scanner, for carrying out at least one embodiment of the method.

BRIEF DESCRIPTION OF THE DRAWINGS

Further advantages and details of the present invention will become evident from the example embodiments described in the following text, and from the drawings. The described examples do not represent any restriction to the invention. In the figures:

FIG. 2 shows a schematic flowchart of the method according to an embodiment of the invention, and FIGS. 3 and 4 show schematic illustrations of basic ideas for calculation of corrections.

DETAILED DESCRIPTION OF THE EXAMPLE EMBODIMENTS

Figure 1:
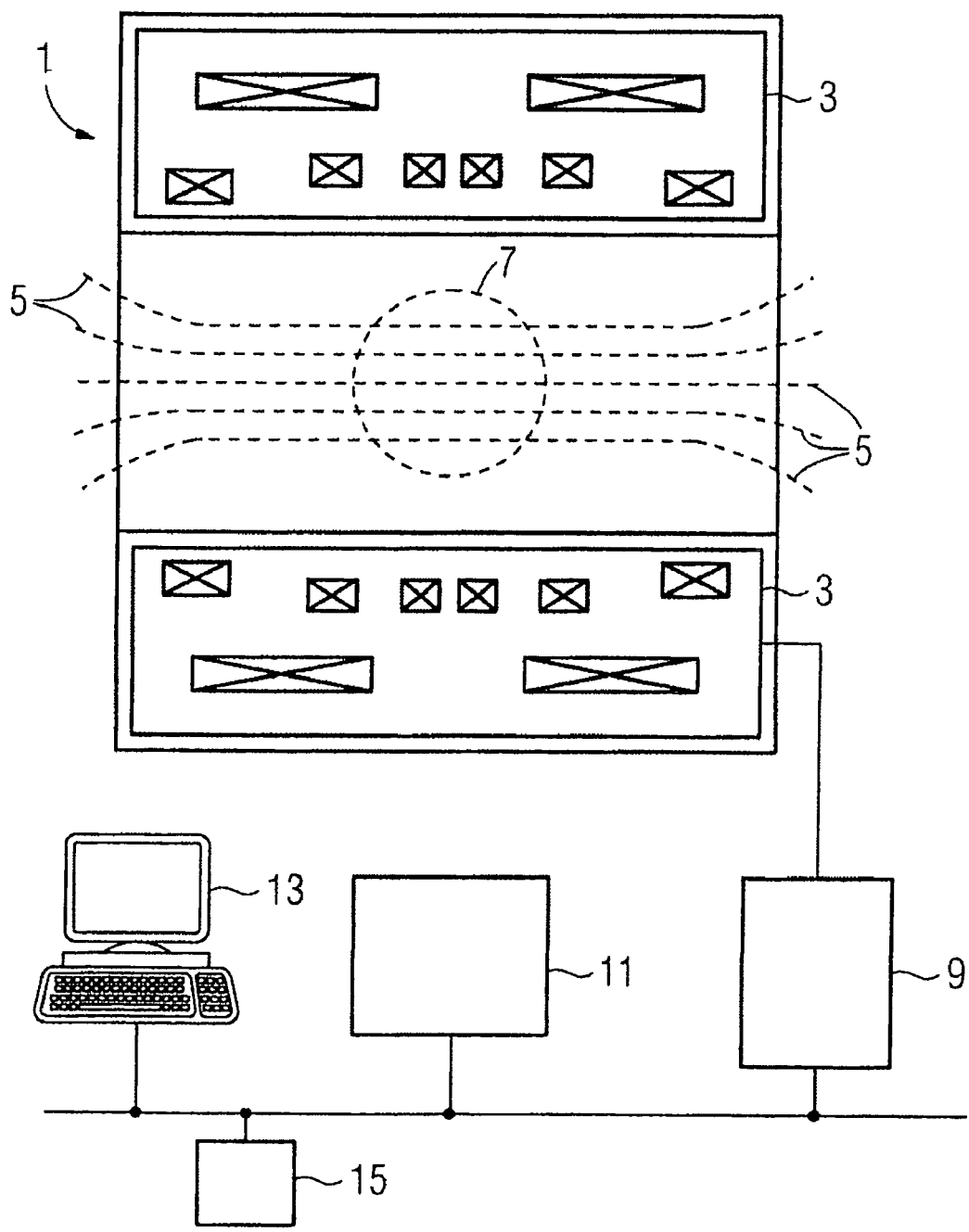
FIG. 1 shows a schematic layout of a magnetic resonance scanner.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein; the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows, schematically, a side view of the layout of a magnetic resonance scanner 1. Only those parts which are significant to embodiments of the invention are illustrated in this case. Further parts, such as a couch, local coils, gradient coils and units for controlling them, are adequately known from the prior art and are not illustrated, for the sake of clarity.

In particular, the magnetic resonance scanner 1 has a supraconducting basic field magnet 3. The basic field magnet 3, normally a cryogenic magnet 3 with an opening in the form of a tunnel, or an open magnet, produces a strong basic magnetic field 5 (represented by exemplary field lines sketched by dashed lines), which is normally between 0.2 Tesla and 3 Tesla or more. The basic magnetic field 5 is homogeneous in a measurement volume 7 of the magnetic resonance scanner 1 except for relatively minor local discrepancies from a nominal value.

In order to examine an object by way of magnetic resonance imaging, various magnetic fields which are matched to one another as accurately as possible in terms of their time and spatial characteristics are applied to the body. The magnetic resonance signals produced in this way are measured as measurement data.

An object to be examined is placed on a couch (not illustrated here) and is positioned in the measurement volume 7 in order to record measurement data.

A control unit 9 controls the magnetic resonance scanner, in particular during the acquisition of the measurement data.

An image processing unit 11 uses the measurement data to produce an image data record, which is displayed to a user via a control console 13, or is stored in a memory unit 15.

The image processing unit 11 is in this case designed such that the method according to an embodiment of the invention can be carried out using the image processing unit 11, if appropriate together with the control unit 9. For this purpose, for example, a computer program according to an embodiment of the invention is installed in the image processing unit 11 and/or the control unit 9 such that it can be run.

An image processing unit 11 which is designed to carry out the method according to an embodiment of the invention may, however, also be operated independently of a magnetic resonance scanner 1.

FIG. 2 uses a flowchart to explain the method according to an embodiment of the invention for correction of distortion in image data records recorded by means of a magnetic resonance scanner. A first image data record (BDS1 for short) and a second image data record (BDS2 for short) are loaded (blocks 21A and 21B).

The first image data record and the second image data record are records of the same examination region of an examination object, and were each recorded using the same magnetic resonance scanner. In this case, the first image data record was recorded using a first frequency coding gradient, and the second image data record was recorded using a second frequency coding gradient, with the first and the second frequency coding gradients differing in their strength and/or direction.

Because the frequency coding gradients differ, the distortion in the first and in the second image data record is also different. The two loaded image data records are therefore not identical.

In a further step (block 23), the first and the second image data record are registered elastically, with transformations required for the registration of the two image data records being stored.

During the registration process, the superimposed transformed data items must be compared using an assessment function. This function must assume its optimum for the situation in which the data is registered correctly. For this purpose, a similarity between the first and the second image data record is determined with the aid of a similarity function, which assesses the similarity of the two image data records by way of a similarity measure.

Examples of similarity measures are, for example: region uniformity or quotient uniformity, based on minimizing suitably defined gray-scale variances, or correlation ratio, mutual information or normalized mutual information, which each build on the notion of entropy from information theory. Further details relating to the individual similarity measures are known from the specialist literature.

A similarity function $NMI(G_1,G_2)$ between image data records $G_1$ and $G_2$ with normalized mutual information (NMI) as a similarity measure is in this case defined as:

$$NMI(G_1, G_2) = \sum_{g_1} \sum_{g_2} p(g_1, g_2) * \log \frac{p(g_1, g_2)}{p(g_1) * p(g_2)},$$

where $p(g_i)$ is the one-dimensional probability distribution of $G_i$ and $p(g_1,g_2)$ is the two-dimensional probability distribution of $G_1$ and $G_2$.

The normalized mutual information therefore relates to the common histogram $H(G_1,G_2)$ and describes the divergence between completely uncorrelated distributions and the histogram H.

The advantage of NMI as a similarity measure is that the image data records to be registered need have only the same structure, but not the same intensities. It is therefore particularly suitable for registration of multimodal image data records, and is particularly advantageous for registration of two magnetic resonance image data records. Furthermore, NMI is largely independent of the degree of overlap between the image data records to be registered and the size of the homogeneous edge areas outside the examination object.

The registration process also includes an imaging function, advantageously for example free-form deformation (FFD) which, for example, maps the second image data record BDS2 onto a transformed image data record T(BDS2). The aim of the registration process in this case is to use the imaging function to transform the second image data record to the first image data record, or vice versa. As an example, the registration of two two-dimensional image data records will be explained in the following text. Registration of three-dimensional image data records will be carried out analogously.

In order to register two two-dimensional image data records as accurately as possible, it is advantageous to use an imaging function which uses a set of local two-dimensional B-spline functions with their checkpoints as transformation parameters.

For this purpose, a checkpoint grid $\Phi$ is placed, for example, on the xy plane initially with $N_x*N_y$ checkpoints $\phi_{ij}=(x_i^\Phi,y_j^\Phi)$ (i=[1,$N_x$]; j=[1,$N_y$]) and initial grid intervals $\delta_x,\delta_y$ over the image data record BDS2 to be transformed. The position of the transformed point $(x_p,y_p)$ is determined on the basis of the checkpoints $\phi_{ij}=(x_i^\Phi,y_j^\Phi)$ and with the aid of the basic functions $B_m(u)$ and $B_n(v)$. The associated B-spline function for elastic deformation of the second image data record BDS2 is in this case as follows:

$$\begin{pmatrix} x_p \\ y_p \end{pmatrix} = \sum_{m=0}^{3} \sum_{n=0}^{3} B_m(u)B_n(v)\underline{A}\begin{pmatrix} x_{i+m-1}^\varphi \\ y_{j+n-1}^\varphi \end{pmatrix},$$

where $$i = \left\lfloor \frac{x_p}{\delta_x} \right\rfloor; \quad u = \frac{x_p}{\delta_x} - i; \quad j = \left\lfloor \frac{y_p}{\delta_y} \right\rfloor; \quad v = \frac{y_p}{\delta_y} - j;$$

and $$B_0(t) = (-t^3 + 3t^2 - 3t + 1)/6; \quad B_1(t) = (3t^3 - 6t^2 + 4)/6;$$

$$B_2(t) = (-3t^3 + 3t^2 + 3t + 1)/6; \quad B_3(t) = t^3/6.$$

The parameters u and v indicate the position in the cell (i,j) such that u,v∈[0,1[. The matrix A is an affine transformation matrix for a first, quick "rough adjustment". This includes, for example, rotation, scaling or translation, etc.

In order to reach the maximum of the normalized mutual information, the checkpoint grid $\Phi$ that is used, that is to say the position of the checkpoints $\phi_{ij}$, is advantageously optimized by way of an optimization function.

A gradient method (gradient ascent) is advantageous in this case. For this purpose, an iteration loop m is introduced over the l=1 ... 2*Nx*Ny parameters $\phi$ of the image BDS2(x,y) to be transformed in this way, in which the position of the checkpoints is adapted depending on the extent of the NMI improvement:

$$\underline{\varphi}^{m+1} = \underline{\varphi}^m + \Delta\underline{\varphi}^m;$$

$$\underline{\varphi} = (x_0^\varphi, y_0^\varphi, x_1^\varphi, y_1^\varphi \ldots x_{N_x}^\varphi, y_{N_y}^\varphi);$$

$$\Delta\underline{\varphi}_l^m = \eta * \frac{\partial}{\partial \varphi_l} NMI(BDS1, T(BDS2)).$$

The process of finding the global maximum of the normalized mutual information is made considerably easier by a multiscalar approach of the check grid, in which its resolution is increased at specific points k in the iteration loop. To this end, new checkpoints are introduced, for example at equal distances at half the original gridpoint interval, the number of which is therefore increased on each occasion to $l^{k+1} = (2*N_x^k-3)*(2*N_y^k-3)$. In this case, the new checkpoint parameters are obtained from the old as:

$$\varphi_{2i,2j}^{k+1} = \frac{1}{64}[\varphi_{i-1,j-1}^k + \varphi_{i-1,j+1}^k + \varphi_{i+1,j-1}^k +$$

$$\varphi_{i+1,j+1}^k + 6(\varphi_{i-1,j}^k + \varphi_{i,j-1}^k + \varphi_{i,j+1}^k + \varphi_{i+1}^k) + 36\varphi_{i,j}^k];$$

$$\varphi_{2i,2j+1}^{k+1} = \frac{1}{16}[\varphi_{i-1,j}^k + \varphi_{i-1,j+1}^k + \varphi_{i+1,j}^k + \varphi_{i+1,j+1}^k + 6(\varphi_{i,j}^k + \varphi_{i,j+1}^k)];$$

$$\varphi_{2i+1,2j}^{k+1} = \frac{1}{16}[\varphi_{i,j-1}^k + \varphi_{i,j+1}^k + \varphi_{i+1,j-1}^k + \varphi_{i+1,j+1}^k + 6(\varphi_{i,j}^k + \varphi_{i+1,j}^k)];$$

$$\varphi_{2i+1,2j+1}^{k+1} = \frac{1}{4}[\varphi_{i,j}^k + \varphi_{i,j+1}^k + \varphi_{i+1,j}^k + \varphi_{i+1,j+1}^k].$$

The use of an optimization function such as this makes it possible to match the geometry of the transformed image data record T(BDS2) virtually completely to that of the first image data record BDS1, and the maximum of the normalized mutual information of T(BDS2) and BDS1 is achieved.

The image elements of the transformed second image data record T(BDS2) shifted by this transformation generally do not coincide exactly with a corresponding image element in the first image data record, which is composed of regularly distributed image elements. It is therefore worthwhile carrying out an intensity interpolation process to determine the intensity values of each regularly distributed image element in the image data record, in order to avoid making the resolution of the transformed image data record poorer.

This can be done by a linear intensity interpolation or a so-called "nearest neighbor" interpolation, or a B-spline method. These methods are adequately known from the prior art. However, the use of one of the two first-mentioned methods can lead to the resolution of the corrected image data record becoming coarser, for which reason it is advantageous to use a further B-spline function for intensity interpolation that is as accurate as possible.

In this case, for example in the case of a two-dimensional B-spline interpolation, the intensity of the transformed second image data record $I^{T(BDS2)}$ at one image point $(x_p,y_p)$ which corresponds to an image element of the transformed image data record is determined as follows by way of the basic functions $B_m(u)$ and $B_n(v)$ and the intensities $I_{BDS2}(x_{i+m-1},y_{j+n-1})$ at surrounding image points $(x_{i+m-1},y_{j+n-1})$ which correspond to the originally shifted image elements:

$$I^{T(BDS2)}(x_p, y_p) = \sum_{m=0}^{3} \sum_{n=0}^{3} B_m(u)B_n(v)I_{BDS2}(x_{i+m-1}, y_{j+n-1}),$$

where:

$$i = \lfloor x_p \rfloor; \quad u = x_p - \lfloor x_p \rfloor; \quad j = \lfloor y_p \rfloor; \quad v = y_p - \lfloor y_p \rfloor;$$

and $$B_0(t) = (-t^3 + 3t^2 - 3t + 1)/6; \quad B_1(t) = (3t^3 - 6t^2 + 4)/6;$$

$$B_2(t) = (-3t^3 + 3t^2 + 3t + 1)/6; \quad B_3(t) = t^3/6.$$

The aim of the registration process is to optimize the transformation parameters in the imaging function such that a second image data record T(BDS2) transformed in this way and the first image data record (BDS1) reach the global maximum of the similarity function. The second image data record is therefore transformed to the first image data record, that is to say the transformed second image data record T(BDS2) geometrically corresponds to the first image data record BDS1.

The first image data record may also analogously be transformed to the second image data record during the registration process, of course, searching for the global maximum of the similarity function of a transformed first image data record T(BDS1) and the second image data record (BDS2). This is done simply by renaming the image data records. The following text also deals with the example in which the second image data record is transformed to the first image data record.

The optimized parameters $\phi_{ij}$ in the registration process result in a transformation shift field which transforms the second image data record to the first image data record (block 25).

The transformation shift field indicates, for each image element in the second image data record, a translation vector $(\Delta x, \Delta y)$ which in each case predetermines how the image elements in the second image data record must be shifted in order to transform the second image data record to the first image data record:

$$\begin{pmatrix} \Delta x \\ \Delta y \end{pmatrix} = \sum_{m=0}^{3} \sum_{n=0}^{3} B_m(u) B_n(v) \begin{pmatrix} x^{\varphi}_{i+m-1} \\ y^{\varphi}_{j+n-1} \end{pmatrix}.$$

A correction shift field for correction of distortion of the first image data record and/or a correction shift field for correction of distortion of the second image data record are/is calculated (block 27) on the basis of the transformation shift field. The correction shift field in this case indicates, for each image element in the image data record to be corrected, a correction vector which eliminates the distortion. A distinction can be drawn between the following situations in the calculation process:

Firstly, when the first and second frequency coding gradient have different directions the correction vector $\vec{k}1$ is obtained for the first image data record, and the correction vector $\vec{k}2$ is obtained for the second image data record, for example in a simple manner by breaking down the associated translation vector into a component k1 which is parallel to the direction $\vec{r}1$ of the first frequency coding gradient, and a component k2 which is parallel to the direction $\vec{r}2$ of the second frequency coding gradient:

$$\begin{pmatrix} \Delta x \\ \Delta y \end{pmatrix} = k1 * \vec{r}1 + k2 * \vec{r}2.$$

If the directions of the frequency coding gradients are mutually perpendicular and have the same strength, then $\Delta x = \Delta y$ and the translation vector runs on the angle bisector (45°).

Since the correction vectors $\vec{k}1$ and $\vec{k}2$ must point in the opposite direction, as in the case of the respective frequency coding gradients, they then simply result in:

$$\vec{k}1 = |k1| * (-\vec{r}1); \vec{k}2 = |k2| * (-\vec{r}2).$$

As an example, what is considered is the simple situation in which the first frequency coding gradient is in the x direction, that is to say $$\frac{\vec{r}1}{|\vec{r}1|} = \begin{pmatrix} 1 \\ 0 \end{pmatrix},$$

and the second frequency coding gradient is in the y direction, that is to say $$\frac{\vec{r}2}{|\vec{r}2|} = \begin{pmatrix} 0 \\ 1 \end{pmatrix}.$$

Correction vectors $\vec{k}1$ and $\vec{k}2$ are then given by:

$$\vec{k}1 = |\Delta x| * \begin{pmatrix} -1 \\ 0 \end{pmatrix} = -\begin{pmatrix} \Delta x \\ 0 \end{pmatrix} = -\sum_{n=0}^{3} B_m(u) B_n(v) \begin{pmatrix} x^{\varphi}_{i+m-1} \\ 0 \end{pmatrix}$$

$$\vec{k}2 = |\Delta y| * \begin{pmatrix} 0 \\ -1 \end{pmatrix} = \begin{pmatrix} 0 \\ \Delta y \end{pmatrix} = \sum_{m=0}^{3} \sum_{n=0}^{3} B_m(u) B_n(v) \begin{pmatrix} 0 \\ y^{\varphi}_{j+n-1} \end{pmatrix}.$$

In this case, the mathematical signs are governed by the direction of the transformation from the second image data record to the first image data record. More details will be provided later with reference to FIG. 3, as well.

If, in contrast, the first and the second frequency coding gradient differ only in their strength, but not in their direction, that is to say both frequency coding directions point, for example, in the x direction, then the translation vectors are given by:

$$\begin{pmatrix} \Delta x \\ \Delta y \end{pmatrix} = \begin{pmatrix} \Delta x \\ 0 \end{pmatrix} = \sum_{m=0}^{3} \sum_{n=0}^{3} B_m(u) B_n(v) \begin{pmatrix} x^{\varphi}_{i+m-1} \\ 0 \end{pmatrix},$$

since the only distortion is along the frequency coding directions.

The direction of the correction vectors for the first image data record and the second image data record k1 and k2 is once again the opposite direction to the frequency coding direction, that is to say in this case the negative x direction $$-\begin{pmatrix} 1 \\ 0 \end{pmatrix}.$$

The magnitudes of the correction vectors are calculated from the ratio of the strengths of the frequency coding gradients as follows:

$$|k1| = \frac{\Delta x_{ro}}{\frac{G_1^{ro}}{G_2^{ro}} - 1};$$

$$|k2| = \frac{\Delta x_{ro}}{1 - \frac{G_2^{ro}}{G_1^{ro}}},$$

where $G_1^{ro}$ is the strength of the first frequency coding gradient, and $G_2^{ro}$ is the strength of the second frequency coding gradient.

The strength of a frequency coding gradient $G_{ro}$ can in this case be calculated easily from the recording parameters which are fixed during a recording, of the pixel bandwidth (pbw), resolution (pix) and field of view ($x_{FoV}$, FoV: "field of view") and the gyromagnetic ratio $\gamma^*$ of protons:

$$G_{ro} = \frac{pbw * pix}{\gamma^* * x_{FoV}}.$$

Distortion in the image data record to be corrected is eliminated (block 29) by shifting the image elements of the first and/or second image data records according to the appropriate correction shift field.

A further intensity interpolation process may then be worthwhile, so-called "resampling".

In a final step, the corrected image data record or the corrected image data records is or are displayed and/or stored (block 31).

FIG. 3 schematically illustrates basic ideas for calculation of corrections in a first and a second image data record, which were recorded using a first frequency coding gradient $G_1{}^{ro}$ and a second frequency coding gradient $G_2{}^{ro}$, whose directions differ (arrows on the left on the outside and at the bottom).

The circle O represented by a dashed line represents an image element at its, initially unknown, original location. The circles B1 and B2 respectively show the distorted position of the image element in the first and in the second image data record. As can be seen, the position is in each case shifted in the direction of the associated frequency coding gradient. For the sake of simplicity, the frequency coding gradients are shown with the same strength, with the length of the arrows of the frequency coding gradients in this case illustrating the respective strength.

As described above, a translation vector t is obtained from the registration of the two image data records, as part of the transformation shift field, and this translation vector t transforms the image element B2 shifted in the second image data record to the image element B1 shifted in the first image data record. Breaking down the translation vector t into its parts parallel to the frequency coding directions (dashed arrows) produces the correction vectors for the first and the second image data record, which shift the shifted image elements B1 and B2 back to their original location O. In this case, care must be taken to ensure that the mathematical signs are chosen correctly. Breaking down the translation vector t produces the dashed arrows from B2 to O and from O to B1. The correction vectors $\vec{k}1$ and $\vec{k}2$ must, however, in each case point from B2 or B1, respectively, to O.

FIG. 4 schematically shows basic ideas for calculation of corrections in a first and a second image data record, which were recorded with a first frequency coding gradient $G_1{}^{ro'}$ and a second frequency coding gradient $G_2{}^{ro'}$, which differ only in their strength but not in their direction (arrows at the top).

Analogously to FIG. 3, the circle O' represented by a dashed line in FIG. 4 represents an image element at its original location, and the circles B1' and B2' respectively indicate the distorted position of the image element in the first and in the second image data record. As can be seen, in this case as well, the position is in each case shifted in the direction of the associated frequency coding gradient in which case, because of the inversely proportional relationship, the distortion is greater the weaker the frequency coding gradient is.

As described above for this situation, a translation vector t' is obtained from the registration of the two image data records in this case as well, transforming the image element from the second image data record to the image element from the first image data record. As described above, in this situation, at least the ratio of the strengths of the frequency coding gradients is also required, in addition to the translation vector, in order to calculate the correction vectors (dashed arrows from B1' and B2' to O' for the first and/or the second image data record.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for correction of distortion, created by discrepancies in a basic magnetic field of a magnetic resonance scanner from a nominal value, in image data records recorded via the magnetic resonance scanner, comprising:
   loading a first image data record, recorded via the magnetic resonance scanner with a first frequency coding gradient, of an examination region;
   loading a second image data record, recorded via the magnetic resonance scanner but using a second frequency coding gradient, of the same examination region, with the first and the second frequency coding gradient being different in direction over two dimensions;

receiving a transformation shift field as final result of a registration process of the first and the second image data record;

calculating a correction shift field for at least one of the first and the second image data record on the basis of the received transformation shift field;

correcting the distortion of at least one of the first and second image data record on the basis of the calculated correction shift field; and at least one of displaying and storing the at least one corrected image data record.

2. The method as claimed in claim 1, wherein the first and the second frequency coding gradient differ in strength.

3. The method as claimed in claim 1, wherein the calculation of the correction shift field for the at least one of the first and second image data record comprises a breakdown of the transformation shift field into components which are parallel to the directions of the first and of the second frequency coding gradient.

4. A computer program which implements a method as claimed in claim 1 on a computation unit, when run on the computation unit.

5. An image processing unit, designed to carry out a method as claimed in claim 1.

6. A magnetic resonance scanner, comprising:
an image processing unit, designed to carry out a method as claimed in claim 1.

7. A method for correction of distortion, created by discrepancies in a basic magnetic field of a magnetic resonance scanner from a nominal value, in image data records recorded via the magnetic resonance scanner, comprising:

loading a first image data record, recorded via the magnetic resonance scanner with a first frequency coding gradient, of an examination region;

loading a second image data record, recorded via the magnetic resonance scanner but using a second frequency coding gradient, of the same examination region, with the first and the second frequency coding gradient being different in strength;

receiving a transformation shift field as final result of a registration process of the first and the second image data record;

calculating a correction shift field for at least one of the first and the second image data record on the basis of the received transformation shift field;

correcting the distortion of at least one of the first and second image data record on the basis of the calculated correction shift field; and at least one of displaying and storing the at least one corrected image data record, wherein the first and the second frequency coding gradient point in the same direction.

8. The method as claimed in claim 7, wherein the calculation of the correction shift field for the at least one of the first and second image data record comprises a ratio of the strengths of the first and of the second frequency coding gradient.

9. The method as claimed in claim 8, wherein the registration of the first and of the second image data record comprises an intensity interpolation process.

10. The method as claimed in claim 9, wherein the intensity interpolation process which is used for registration is carried out by a B-spline method.

11. An image processing unit for correction of distortion, created by discrepancies in a basic magnetic field of a magnetic resonance scanner from a nominal value, in image data records recorded via the magnetic resonance scanner, comprising:

means for loading a first image data record, recorded via the magnetic resonance scanner with a first frequency coding gradient, of an examination region;

means for loading a second image data record, recorded via the magnetic resonance scanner but using a second frequency coding gradient, of the same examination region, with the first and the second frequency coding gradient being different in direction over two dimensions;

means for receiving a transformation shift field as final result of a registration process of the first and the second image data record;

means for calculating a correction shift field for at least one of the first and the second image data record on the basis of the received transformation shift field;

means for correcting the distortion of at least one of the first and second image data record on the basis of the calculated correction shift field; and means for at least one of displaying and storing the at least one corrected image data record.

12. A magnetic resonance scanner, comprising:
an image processing unit as claimed in claim 11.

13. A computer readable medium including program segments for, when executed on a computer device, causing the computer device to implement the method of claim 1.

* * * * *